United States Patent [19]

Kirsch

[11] Patent Number: 4,704,547
[45] Date of Patent: Nov. 3, 1987

[54] IGFET GATING CIRCUIT HAVING REDUCED ELECTRIC FIELD DEGRADATION

[75] Inventor: Howard C. Kirsch, Emmaus, Pa.

[73] Assignee: American Telephone and Telegraph Company, AT&T Bell Laboratories, Murray Hill, N.J.

[21] Appl. No.: 20,142

[22] Filed: Feb. 25, 1987

Related U.S. Application Data

[63] Continuation of Ser. No. 680,167, Dec. 10, 1984, abandoned.

[51] Int. Cl.⁴ .................. H03K 17/06; H03K 17/687; H03K 19/003; H03K 19/094
[52] U.S. Cl. ................. 307/443; 307/200 B; 307/451; 307/542; 307/576; 307/585
[58] Field of Search ............ 307/445, 200 B, 451, 307/576, 579, 585, 270, 255, 288, 443, 542; 365/104, 156, 181, 190

[56] References Cited

U.S. PATENT DOCUMENTS

| | | | |
|---|---|---|---|
| 3,818,245 | 6/1974 | Suzuki et al. | 307/270 |
| 3,900,746 | 8/1975 | Kraft et al. | 307/475 X |
| 4,069,430 | 1/1978 | Masuda | 307/270 |
| 4,185,209 | 1/1980 | Street | 307/451 X |
| 4,274,014 | 6/1981 | Schade, Jr. | 307/585 |
| 4,295,065 | 10/1981 | Hsieh et al. | 307/451 X |
| 4,443,715 | 4/1984 | Fox | 307/270 |
| 4,454,571 | 6/1984 | Miyashita | 307/200 B X |
| 4,465,945 | 8/1984 | Yin | 307/451 X |
| 4,481,432 | 11/1984 | Davies, Jr. | 307/451 X |
| 4,490,629 | 12/1984 | Barlow et al. | 307/451 |
| 4,499,388 | 2/1985 | Adam | 307/451 X |
| 4,518,873 | 5/1985 | Suzuki et al. | 307/451 |
| 4,527,254 | 7/1985 | Ryan et al. | 365/51 |
| 4,578,600 | 3/1986 | Magee | 307/451 |
| 4,593,214 | 6/1986 | Proebsting | 307/578 |
| 4,594,519 | 6/1986 | Ohtani et al. | 307/451 X |

FOREIGN PATENT DOCUMENTS 2803811 8/1978 Fed. Rep. of Germany ...... 307/475

OTHER PUBLICATIONS

Dingwall, "Improved COS/MOS Inverter Circuit for Reducing Burnout and Latchup", RCA Technical Notes, 1230, pp. 1-4, Jul. 25, 1979.
"Structure-Enhanced MOSFET Degradation Due to Hot-Electron Injection", IEEE Electron Device Letters, vol. EDL-5, No. 3, H. R. Grinolds et al., Mar. 1984, pp. 71-74.
"Design and Characteristics of the Lightly Doped Drain-Source (LDD) Insulated Gate Field-Effect Transistor", IEEE Transactions on Electron Devices, vol. ED-27, No. 8, D. L. Critchlow et al., Aug. 1980, pp. 1359-1367.

Primary Examiner—Stanley D. Miller
Assistant Examiner—David R. Bertelson
Attorney, Agent, or Firm—James H. Fox

[57] ABSTRACT

As integrated field effect devices are scaled to smaller dimensions, the electric field in the channel increases for a constant operating voltage. This induces "hot electron" effects that reduce device reliability. The present invention reduces the voltage (and hence electric field) across one or more transistors in various complementary (e.g. CMOS) logic circuits. This is achieved while still obtaining a full logic swing (e.g., 0-5 volts) at the output of the logic. The technique also allows the retention of previous voltage levels (e.g., 5 volts) for operation of other portions of the integrated circuit (e.g., dynamic memory cells).

8 Claims, 6 Drawing Figures

IGFET GATING CIRCUIT HAVING REDUCED ELECTRIC FIELD DEGRADATION

This application is a continuation of application Ser. No. 680,167, filed Dec. 10, 1984, now abandoned.

BACKGROUND OF THE INVENTION

1. Field of the Invention

The present invention relates to circuitry implemented in complementary transistor technology that obtains an improved reliability from electric field induced failures.

2. Description of the Prior Art

In the production of integrated circuits, the reduction in the size of transistors is of great significance, in order to increase the functionality on a given semiconductor chip. However, as device geometries decrease, failure modes become apparent that were not so important at larger device sizes. For example, the "hot electron" effect has received considerable attention. This effect relates to the fact that in a field effect transistor, as the channel length decreases, the electric field in the channel increases if the operating voltage is maintained at previous levels (for example, at five volts). This increased electric field may cause the electrical carriers (i.e., holes or electrons) to gain sufficient energy as they traverse the channel to induce avalanching. When avalanching occurs, additional carriers are generated and some of these carriers may become trapped in the gate oxide region overlying the channel. These trapped charges may produce what are referred to as "fast states", which have deleterious effects on the subsequent device operation. For example, it is known that trapped charges can reduce the gain of the device, as well as change the threshold voltage; that is, the voltage between the gate and the source at which the device begins to conduct through the channel.

One remedy for degradation due to hot carriers or other electric field induced effects is simply to reduce the operating voltage on the field effect devices. However, that is not always practical. For example, in dynamic random access memories (DRAMS), it is usually desired to operate the memory portion of the circuit at a relatively high voltage in order to obtain maximum stored charge in the capacitor. At present, the nominal operating voltage for most DRAMS is five volts, plus or minus 0.5 volts. In contrast, the peripheral logic circuitry employed in the DRAMS, for example, the row and column decoders, buffers, inverters, clock circuits, etc., are desirably operated at a lower voltage (at the present state of device geometries) in order to reduce the abovenoted degradation effects. One solution has been to provide a voltage reducing circuit to provide a low voltage (e.g., 3 volts) to the logic circuits, while maintaining the full voltage (e.g., 5 volts) on the memory array. However, that limits the output swing from the integrated circuit to the lower value (e.g., 0-3 volts), which can cause problems in interfacing with other circuits designed to operate at the higher voltage.

In some cases, failure likelihood is even further increased when electric potentials exist in excess of the operating voltage. That is, a capacitor can temporarily elevate a given node above the most positive power supply voltage. For example, a "boosted node" in a clock circuit can obtain a voltage of about 7 to 8 volts for a circuit having a 5 volt power supply. An even higher voltage is possible for a double-boosted node. To discharge a boosted node to ground (0 volts), there is typically employed an n-channel MOS field effect transistor (e.g., T12 in FIG. 1). A positive clock signal (e.g., 5 volts) is applied to the gate (12) of T12 when discharge of node 10 is desired. To protect this discharge transistor, there has been employed a second transistor (e.g., T11) that drops a portion of the boosted potential. The gate (11) of the second transistor in some cases is connected to the gate (12) of the discharge transistor, or to another clock signal. In other cases, the gate (11) has been connected to the positive power supply voltage (e.g., 5 volts). The voltage thus applied to the drain of T12 (at 15) is then the voltage applied to the gate (11) of T11, minus the threshold voltage drop of T11, which is typically about 1 to 2 volts.

Another method of reducing the effects of high electric potentials is the so-called lightly doped drain structure. In that technique, the doping concentration at the drain (and typically also the source) is reduced in the vicinity of the channel, and increased away from the channel. This allows both good electrical conduct to be made to the source and drain regions while reducing the electric field in the vicinity of the channel. See for example, "Design and Characteristics of the Lightly Doped Drain-Source (LDD) Insulated Gate Field-Effect Transistor," S. Ogura et al, *IEEE Transactions on Electron Devices*, Volume ED-27, pages 1359-1367 (1980). However, in some cases it is desirable to augment the protection against device degradation that the LDD structure provides. In still other cases, it is desirable to avoid the increased processing complexity that the LDD structure requires, while still providing for device protection against excessive operating fields. Furthermore, as noted above in the case of the dynamic random access memories, there are times when it is desirable to both obtain protection against excessive electric fields for certain portions of the circuit (e.g., logic portions) while providing increased operating voltages for optimum performance of other portions of the circuit (e.g., information storage cells). It is also desirable that the logic circuits be able to supply the full power supply output voltage swing (e.g., 0-5 volts).

SUMMARY OF THE INVENTION

I have invented a technique whereby a protective field effect transistor is connected in a series string of complementary field effect logic transistors. The voltage on the gate of the protective transistor is chosen so that the drain-to-source voltage across a transistor being protected does not exceed a desired value. The protective voltage is typically less than one threshold voltage more negative or more positive than the power supply voltages applied to the logic transistors. Logic devices that can advantageously be protected by the present technique include inverters, NAND gates, and NOR gates. In one embodiment, the control voltage on the gate of the protective transistor is regulated at a given voltage. The present technique provides that portions of an integrated circuit (e.g., memory cells) can operate at the full power supply voltage, whereas other portions (e.g., logic circuits) can be protected from the full power supply voltage, while still supplying the full power supply output voltage swing.

DETAILED DESCRIPTION

The following detailed description relates to a logic circuit implemented in complementary transistor technology having improved protection from operating voltages. Such voltages can otherwise cause degradation due to excessive fields in the channel of a field effect transistor, or by other degradation mechanisms. The present technique will be illustrated in terms of Complementary Metal Oxide Semiconductor (CMOS) field effect technology. However, the circuit technique is applicable to other forms of complementary transistors. For example, when complementary transistors become available in gallium arsenide (or other III-V semiconductor material) technology, they can be protected by the present technique.

Figure 1:
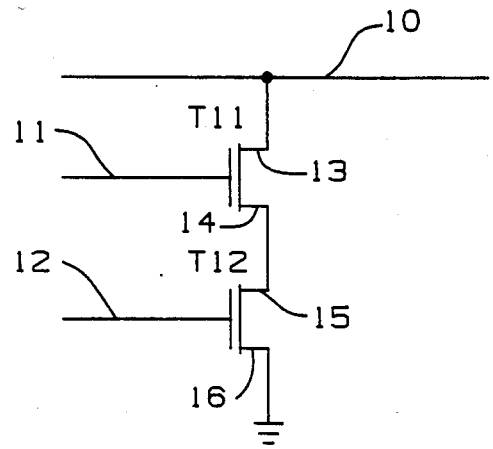
FIG. 1 shows a prior art technique for reducing the voltage across an n-channel field effect transistor that discharges a boosted node.
Figure 2:
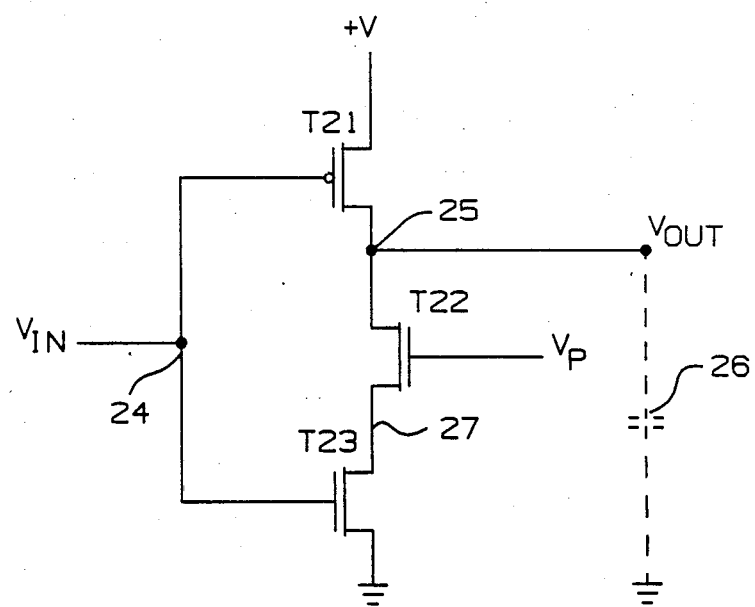
FIG. 2 shows an inverter implemented according to the present technique.

Referring to FIG. 2, a simple inverter is shown, which is included in the term "logic circuit" as used herein. In this circuit a protective transistor T22 has a source-drain path that is serially inserted in the path between the drains of logic transistors T21 and T23. Note that complementary transistors T21, T23 otherwise would form by themselves a conventional complementary pair. The input logic signal is applied from common input node 24 to the gates of transistor T21 and T23, whereas the output logic signal is taken from the drain of p-channel transistor T21 and the drain of n-channel transistor T22, at common output node 25. For typical MOS devices, the n-channel transistors are degraded more rapidly by excessive fields than are p-channel transistors. Hence, protective transistors T22 in the inventive technique provides that the source-drain potential of n-channel transistor T23 is limited so as not to exceed a given value, even though the positive power supply potential (+V) increases beyond this value. To achieve this end, the gate voltage of protective transistor T22 is placed at voltage $V_P$ with respect to ground. This voltage is a d.c. value, which may be a constant, or may be clamped so as to not exceed a given amount, as explained further below. The drain voltage (referenced to ground) on T23 is then limited to $V_P - V_{th}$, where $V_{th}$ is the threshold voltage drop across protective transistor T22. The positive voltage (+V), and the negative voltage (ground) are typically supplied by power terminals adapted to contact the appropriate power supply potentials.

In typical operation the positive power supply voltage (+V) is in the range of 4.5 to 5.5 volts and typically about 5.0 volts, which is conventionally designated $V_{CC}$. The gate voltage $V_P$ on protective transistor T22 is typically about 4.5 to 5.5 volts. Transistor T22 has a threshold voltage drop of typically 1 to 2 volts, and in an exemplary case about 1.6 volts. This implies that the source voltage of protective transistor T22 (node 27), which supplies the drain voltage of logic transistor T23, does not exceed approximately 3.9 volts. The precise degree that excessive voltages reduce transistor performance over time varies with transistor type and geometry. However, even a relatively small reduction in applied voltage (e.g., 20 percent) typically has a relatively large effect (e.g., a 100 percent increase) on the useful life of a transistor. Thus, n-channel transistor T23 has substantially increased protection against degradation effects induced by high operating voltages.

Furthermore, note that in the present technique, the output voltage swing at output node 25 still achieves the full power supply excursion. That is, when a positive input voltage is present at input node 24, p-channel transistor T21 is placed in a non-conducting state, whereas n-channel transistor T23 conducts. Hence, node 25 drops substantially to the ground (0 volt) potential. Note that this can be obtained because the gate voltage on protective transistor T22 is sufficiently positive with respect to its source that T22 also conducts, allowing current flow between the output node 25 and ground. Conversely, when the input voltage at node 24 is in a low voltage state, p-channel transistor T21 conducts, whereas n-channel transistor T23 is turned off. Hence, the voltage at output node 25 rises to substantially the positive power supply potential. Hence, in a typical case, a full 0-5 volt logic swing is obtained, while limiting the potential across n-channel transistor T23 to a substantially lower vlaue than the most positive logic swing.

Figure 3:
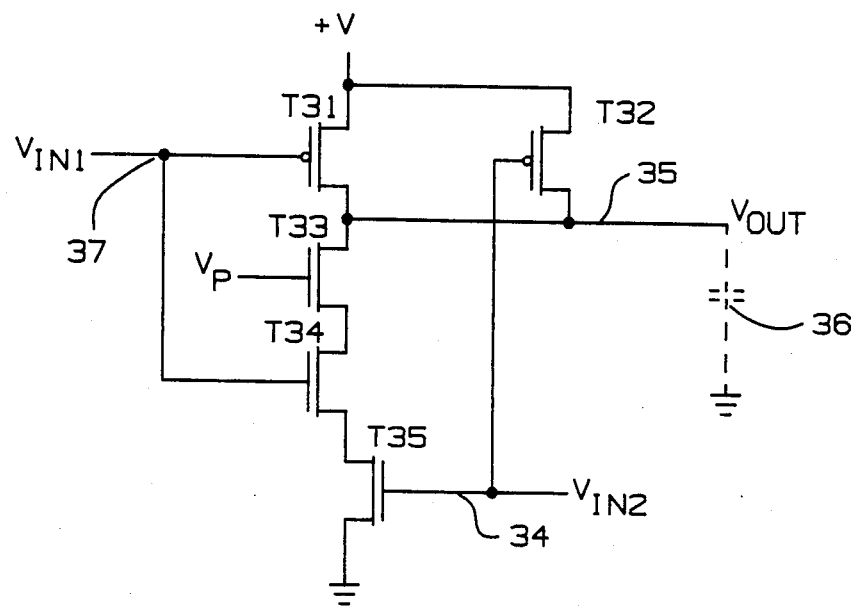
FIG. 3 shows a NAND gate implemented according to the present technique.

The inventive technique can be extended from the case of the simple inverter to more complex logic. Referring to FIG. 3, a two input NAND gate is illustrated. One logic input signal ($V_{IN1}$) is applied to the gate of p-channel transistor T31 and n-channel transistor T34, whereas the other logic input signal ($V_{IN2}$) is applied to the gate of p-channel transistor T32 and n-channel transistor T35. As indicated, the source and drain connections of the p-channel transistors T31 and T32 are in parallel, being located between the positive voltage +V and the output node 35. Located in series with the source-drain path of logic transistors T34 and T35 is protective transistor T33. Applied to the gate of transistor T33 is the protective voltage $V_P$, which can have the values as indicated above. Thus, the drain-to-source voltage across transistors T34 and T35 are limited to less than the full power supply voltage +V, while $V_{OUT}$ still obtains the full power supply swing. Additional inputs for the NAND gate can be provided by adding p-channel transistors in parallel, and n-channel transistors in series, in an analogous manner.

Figure 4:
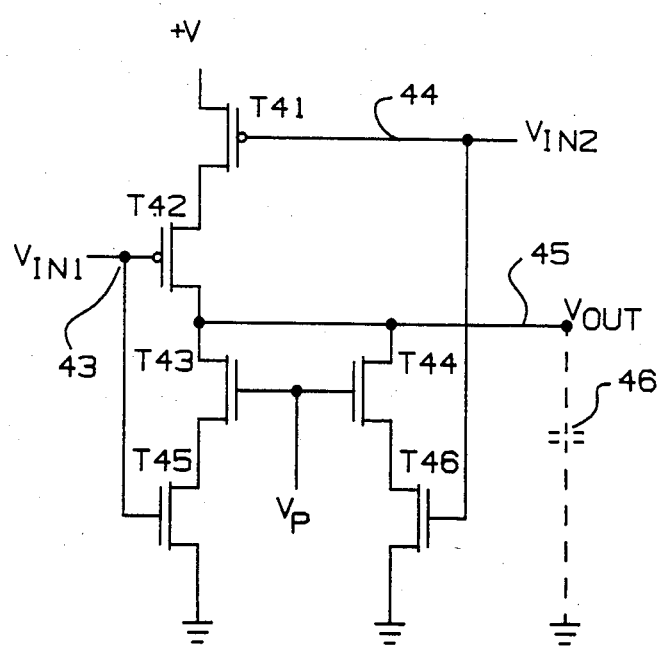
FIG. 4 shows a NOR gate implemented according to the present technique.

A two input NOR gate is illustrated in FIG. 4. As indicated, one logic input signal ($V_{IN1}$) is applied to the common gate connection of p-channel transistor T42 and n-channel transistor T45, at node 43. The other input signal ($V_{IN2}$) is applied to the common gate node 44 of transistors T41 and T46. In the circuit illustrated, the protective transistors are T43 and T44, having a common gate node connected to voltage $V_P$ as above. Note that protective transistor T43 limits the voltage on logic transistor T45, whereas protective transistor T44 limits the voltage on logic transistor T46. The use of two protective transistors in this manner provides a degree of decoupling between the logic transistors T45 and T46. However, if desired, a single protective transistor (e.g., T43) can be used, by connecting the drain of transistor T46 to the drain of transistor T45.

The addition of the protective transistor has been found to have a minimal effect on the speed of operation of the logic circuits. In an illustrative embodiment, a five volt power supply is utilized and the transistors have a channel length of about 1.3 micrometers. For the circuit of FIG. 2, with transistor T21 having a channel width of 50 micrometers, protective transistor T22 having a channel width of 50 micrometers, and transistor T23 having a channel width of 30 micrometers, a typical propagation delay of about 1.5 nanoseconds is obtained when driving a load capacitor (26) of 1 picofarad. To achieve an approximately comparable delay when driving a 1 picofarad load for the circuit of FIG. 3, transistors T31, T32 have channel widths of 50 micrometers each, transistors T34, T35 have channel widths of 60 micrometers each, and transistor T33 has a channel width of 50 micrometers. For the circuit of FIG. 4, transistors T41 and T42 have channel widths of 100 micrometers each, transistors T43, T44 have channel widths of 50 micrometers each, and transistors T45, T46 have channel widths of 30 micrometers each, to obtain the above-noted performance.

Figure 5:
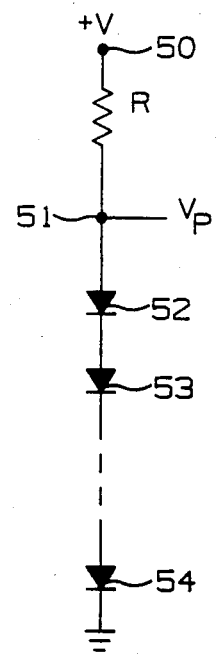
FIG. 5 shows one technique for clamping the gate voltage on the protective transistor.

A common supply voltage can supply the protective gate voltage ($V_P$) to all of the protective transistors, so that only a single protective bias source is needed on an integrated circuit chip, or wafer, in the case of wafer scale integration. If desired, different portions of the circuit can have a different gate voltage on the protective transistors. The circuit that generates $V_P$ typically is also implemented on the same integrated circuit as the logic circuits protected. Then, $V_P$ may conveniently by derived from the electrical potentials that power the logic circuits. However, $V_P$ may be provided from an external source if desired. It is possible to have $V_P$ track the positive power supply voltage until a certain level is reached, above which $V_P$ is clamped at a constant value. For example, referring to FIG. 5, the positive power supply voltage V+ is applied to node 50. The voltage $V_P$ is then impressed on node 51 through the current limiting resistor (R). The voltage at node 51 is clamped by means of the diodes (52–54), as indicated. With silicon p-n junctions having a typical voltage drop of approximately 0.6 volts, it can be seen that a series connection of 8 such diodes then provide a maximum $V_P$ voltage of about 4.8 volts. When the positive power supply voltage exceeds 4.8 volts, the $V_P$ voltage is then clamped to this fixed value. However, at lower voltages, for example, if the circuit is operating at a voltage of 4.5 volts, then $V_P$ is also approximately 4.5 volts. This provides for a suitably high speed of operation of the logic circuits at voltages below a specific value, and prevents degradation of the logic transistors if the circuit is operated above its specified voltage. Such excessive voltage may be present in the testing of an integrated circuit. Other voltage limiting means can be envisioned; for example, a zener or avalanche diode can replace the series string of diodes 52–54. Also, more elaborate voltage control means are possible (e.g., a band-gap reference) which can provide, if desired, compensation for temperature or processing variations.

Figure 6:
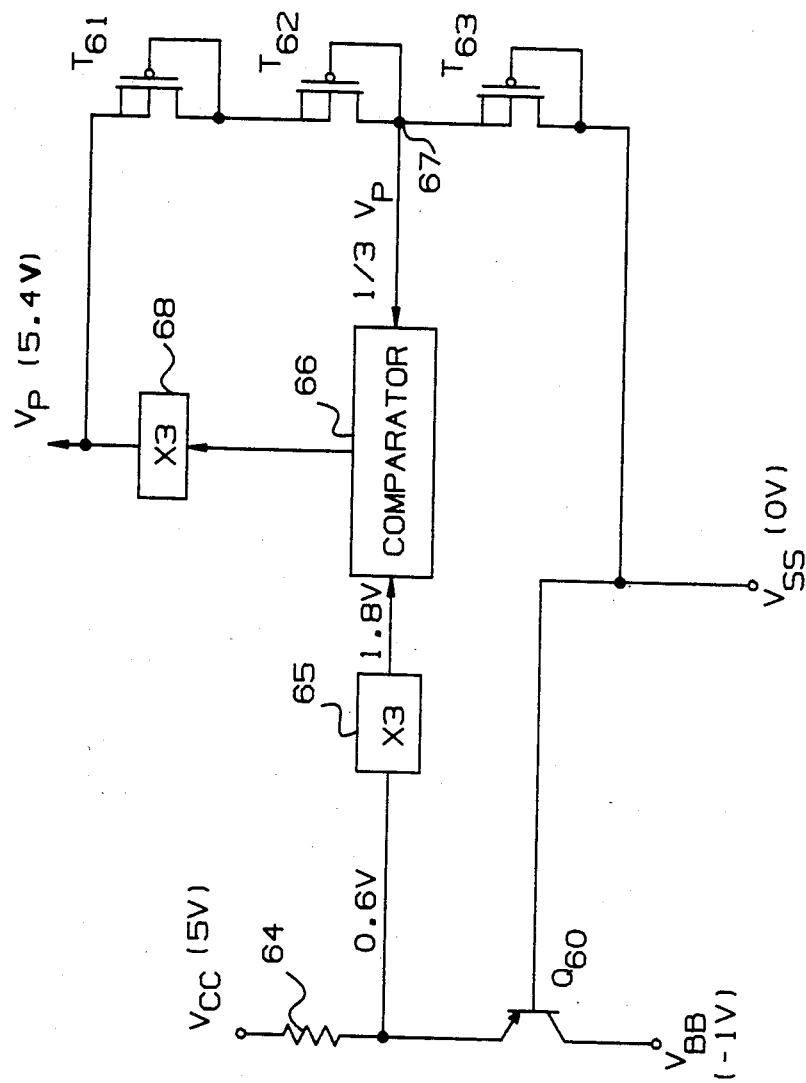
FIG. 6 shows a circuit suitable for providing a constant voltage to the gate of the protective transistor.

A presently preferred means for supplying the protective voltage keeps $V_P$ at a substantially fixed level, regardless of power supply variations. Referring to FIG. 6, the protective voltage is derived from bipolar transistor Q60, wherein a base-emitter voltage drop ($V_{BE}$) of about 0.6 volts is obtained. This voltage is multiplied 3 times in a voltage tripler 65, which may be of a conventional type. The 1.8 volt output is supplied to a comparator 66, which in turn supplies approximately 1.8 volts to a second voltage tripler 68 to produce a protective voltage $V_P$ of about 5.4 volts. This voltage is also supplied to a series string of p-channel transistors T61–T63. Each of these transistor has its source connected to its substrate, which is possible when each transistor is formed in a separate n-tub, according to principles known in the art. The three transistors T61–T63 serve as a voltage divider, which each one dropping an equal voltage thereacross, between $V_P$ and $V_{SS}$ (0 volts). Hence, a voltage of $\frac{1}{3}V_P$ appears at node 67, and is supplied to comparator 66. The comparator compares the $\frac{1}{3}V_P$ voltage to the 1.8 volts derived from Q60, and adjusts the voltage supplied to tripler 68 to maintain them equal. The resulting $V_P$ (5.4 volts) is substantially independent of power supply voltage changes over the expected operating range, including excursions to high voltage levels for testing purposes (e.g., +V=7 volts). Note that this circuit also maintains $V_P$ at a constant value when +V drops to values below 5 volts, so that performance of the logic circuits is not degraded by $V_P$ being too low.

While the foregoing description has illustrated the protection of n-channel devices, the protection of p-channel devices can be similarly provided for by the present technique. Future reliability concerns may make that desirable in lieu of, or in addition to, the n-channel protection. For this purpose, a p-channel protective transistor can be provided, serially connected with one or more p-channel logic transistors and having a gate voltage at a desired protective value. This value is typically less than one threshold voltage drop more negative than the negative power supply voltage applied to the logic circuit. The output is then taken from the node common to the p-channel protective transistor and one or more n-channel logic transistors, in analogy to the foregoing. Note also that the protective transistor typically limits the voltage across the protected transistor to less than the nominal power supply voltage (e.g., less than 5 volts). However, it is possible to set the limit at a higher value, in order to protect only against aging effects during high-voltage burn-in testing, or during high-voltage transients that might be encountered in operation.

The present technique thus provides for protection for devices in integrated circuits by limiting the operating voltage on desired logic devices to less than the voltage across the power terminals. This is accomplished while still providing the output voltage swing defined by the power supply voltage, and also retaining the full power supply voltage for use in other portions of the circuit, as desired.

What is claimed is:

1. An integrated circuit comprising first and second terminals for connection to a power supply voltage, a first field effect transistor of a first conductivity type, and a second field effect transistor of a second conductivity type opposite to said first conductivity type, with the gates of said transistors being coupled to a common input node, and with the source of said first transistor being connected to a first voltage node, and with the source of said second transistor being connected to a second voltage node, characterized in that said integrated circuit further comprises a protective transistor of said second conductivity type, wherein said protective transistor has its drain connected to the output node of said logic circuit, and its source connected in the drain current path of said second transistor, and its gate connected to means for supplying a regulated DC protective voltage, wherein said regulated voltage remains relatively constant as compared to changes in said power supply voltage over an expected operating range.

2. The integrated circuit of claim 1 wherein said transistors are insulated gate field effect transistors.

3. The integrated cricuit of claim 2 wherein the gate electrodes of said transistors are insulated from the channels of said transistors by an insulator comprising silicon dioxide, and wherein the channels of said transistors are essentially comprised of silicon.

4. The integrated circuit of claim 1 wherein said power supply voltage is nominally 5 volts.

5. The integrated circuit of claim 1 wherein the expected operating range of the power supply voltage is 4.5 to 5.5 volts.

6. The integrated circuit of claim 1 wherein said first voltage node is connected to said first terminal, and said second voltage node is connected to said second terminal.

7. The integrated circuit of claim 1 wherein said first voltage node is connected to means for boosting the voltage on said first voltage node in excess of the voltage on said first terminal.

8. The integrated circuit of claim 1 further comprising an array of dynamic random access memory cells.

* * * * *